United States Patent [19]

Pomatto et al.

[11] Patent Number: 4,899,440

[45] Date of Patent: Feb. 13, 1990

[54] METHOD AND APPARATUS FOR LOCATING TARGETS ON A PANEL AND PERFORMING WORK OPERATIONS THEREON

[75] Inventors: Larry A. Pomatto, Santa Ana; Kevin T. Franklin, San Diego, both of Calif.

[73] Assignee: Systems Analysis and Integration, Anaheim, Calif.

[21] Appl. No.: 948,329.

[22] Filed: Dec. 31, 1986

[51] Int. Cl.$^4$ .......................... H05K 3/00; B23P 21/00
[52] U.S. Cl. ........................................ 29/846; 29/707; 156/64; 408/1 R
[58] Field of Search .................. 408/1 R, 13; 29/832, 29/846, 707, 706; 156/64; 271/30.1, 5; 414/118, 121, 225

[56] References Cited

U.S. PATENT DOCUMENTS

| | | | |
|---|---|---|---|
| 3,625,377 | 12/1971 | Bohannon et al. | 414/118 |
| 4,536,239 | 8/1985 | Benson | 156/64 |
| 4,596,500 | 6/1986 | Raiteri | 408/13 X |
| 4,687,403 | 8/1987 | Motoda | 414/225 X |
| 4,708,545 | 11/1987 | Fujii et al. | 408/1 R X |

FOREIGN PATENT DOCUMENTS

| | | | |
|---|---|---|---|
| 60-238208 | 1/1985 | Japan | 408/1 R |
| 61-125711 | 6/1986 | Japan | 408/1 R |
| 61-125714 | 6/1986 | Japan | 408/1 R |
| 61-125715 | 6/1986 | Japan | 408/1 R |

*Primary Examiner*—Carl J. Arbes
*Attorney, Agent, or Firm*—Gordon L. Peterson

[57] ABSTRACT

A method and apparatus for use with a panel having at least first and second targets thereon detectable with x-rays and comprising relatively moving the panel and an x-ray detection apparatus along a search path to locate the targets on the panel. With the targets located work operations, such as drilling and shearing, are performed on the panel.

39 Claims, 5 Drawing Sheets

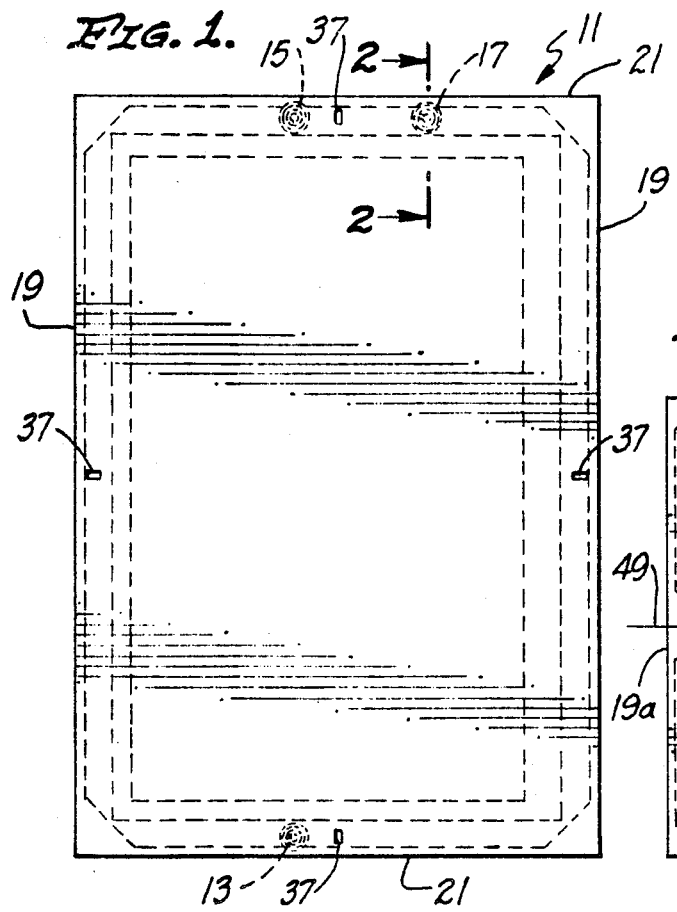
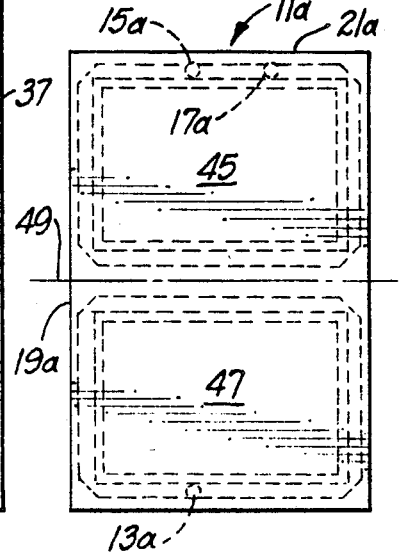
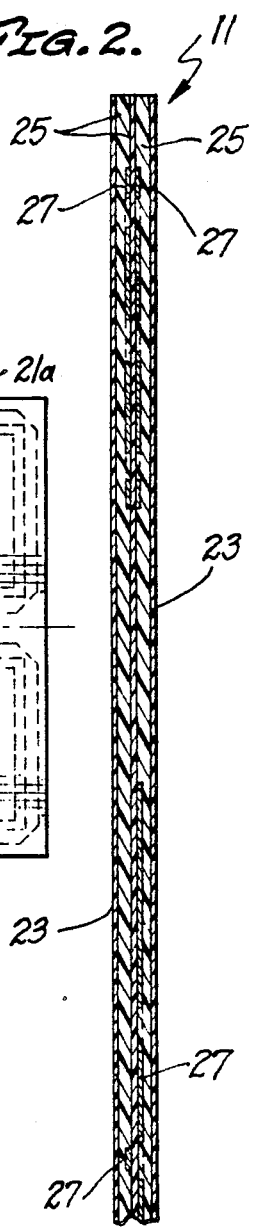
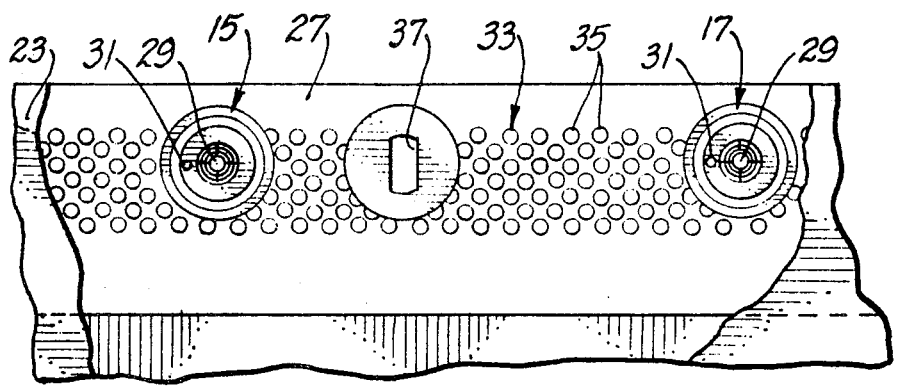
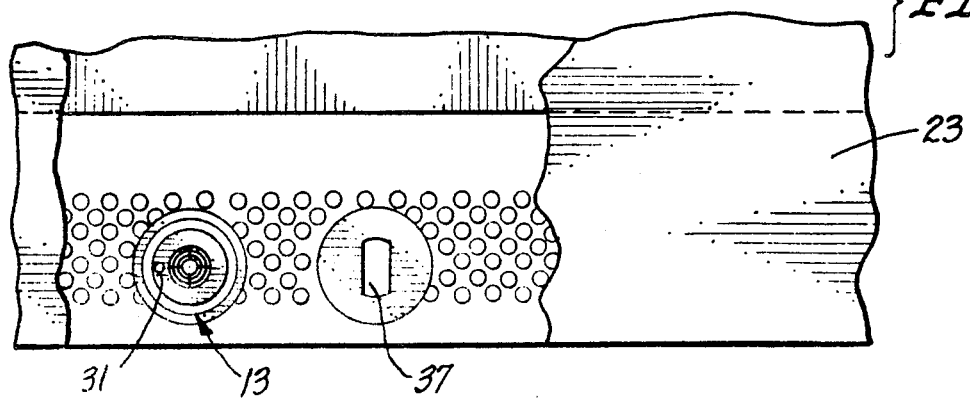

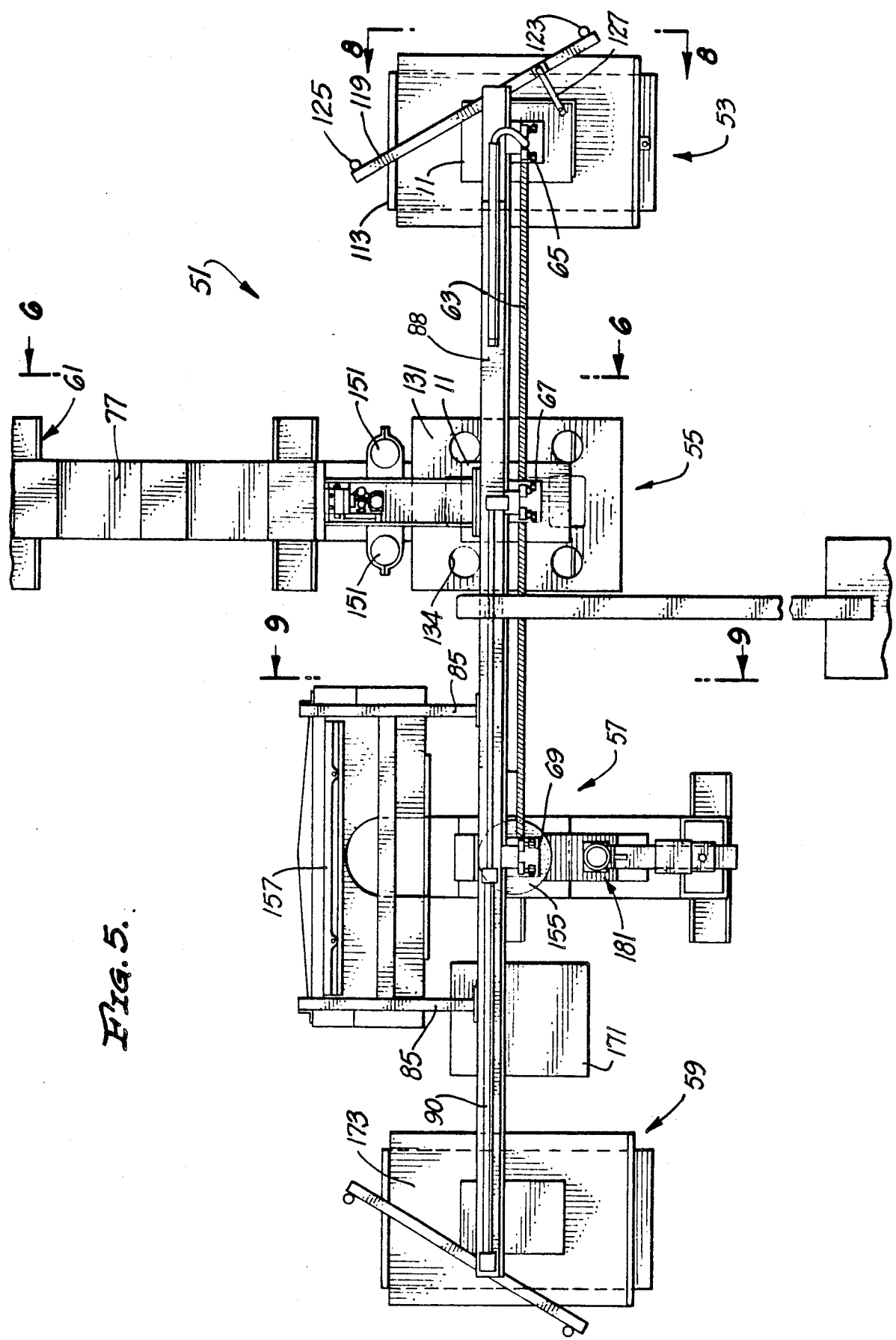

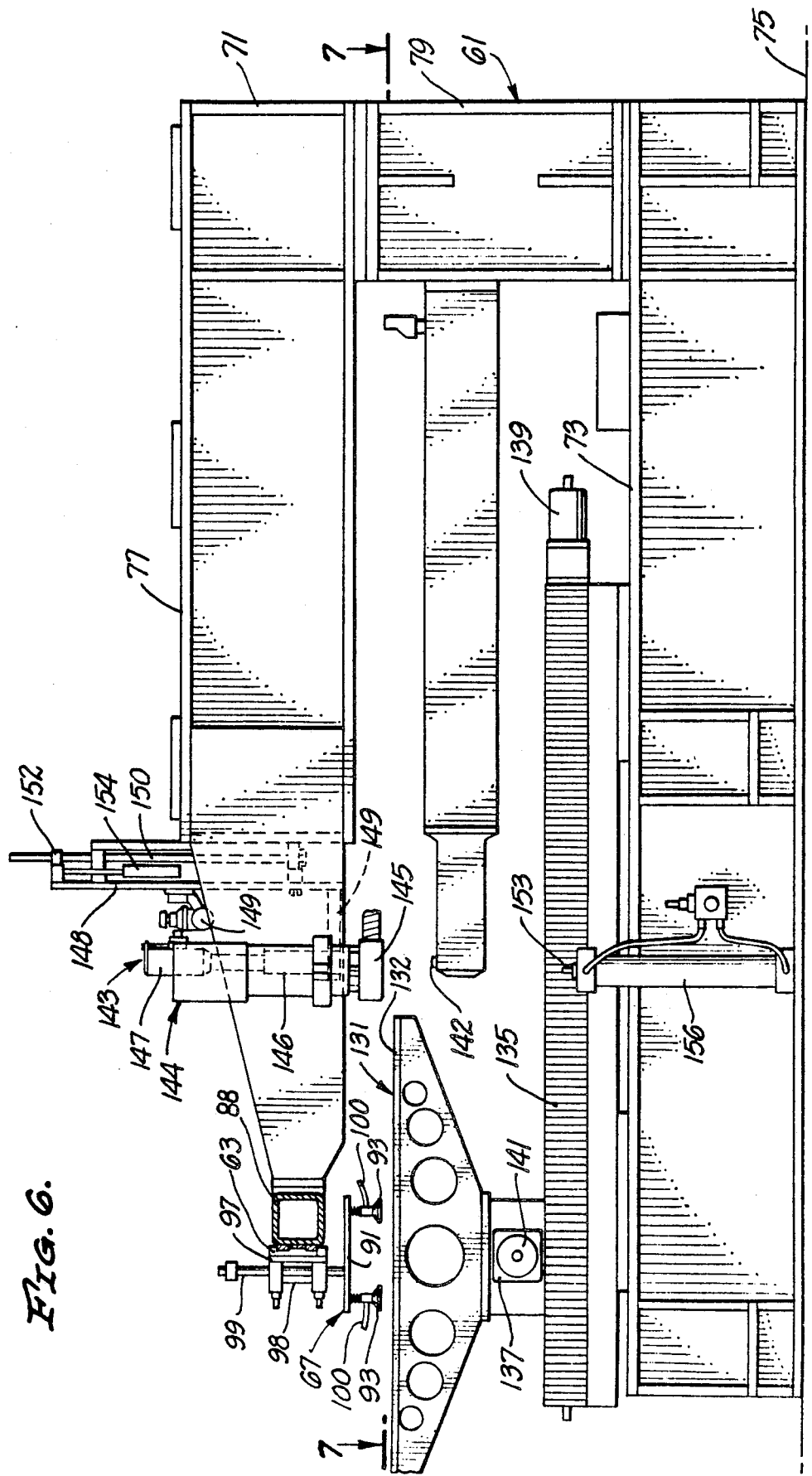

METHOD AND APPARATUS FOR LOCATING TARGETS ON A PANEL AND PERFORMING WORK OPERATIONS THEREON

BACKGROUND OF THE INVENTION

In the manufacture of printed circuit boards, it is necessary to very accurately orient the board so that various work operations can be properly performed on the board. To accomplish this, printed circuit boards typically have targets at locations where the registration holes are to be drilled. These targets are manually located, and the manual location process may require partly sanding or grinding off a portion of the copper face sheet of the printed circuit board to enable the targets to be visibly identified. With the targets visibly located, the registration holes are drilled, and then the four edges of the printed circuit board are sheared so that the board forms an essentially perfect rectangle. With these preliminary work operations performed, the board can be subsequently located using the registration holes so that additional work operations can be performed.

The manual technique for target location is relatively slow and may, as indicated above, require the additional step of sanding or grinding off portions of the copper face sheet to enable the target to be visibly identified. The manual grinding, drilling and shearing operations are relatively slow and quite labor-intensive and the accuracy obtained is dependent on the skill of the workman. In addition, if the target locations on the board are outside the allowable tolerances, this manual technique has no satisfactory way of ascertaining this. Consequently, with the manual technique, the likelihood of providing registration holes at unacceptable locations is increased.

SUMMARY OF THE INVENTION

This invention automates the target location function, as well as a number of the operations performed subsequently to target location. In addition, target location and the subsequent operations are carried out in a new and advantageous manner Also, this invention enables the registration holes to be formed hearer to the desired location. Although this invention is particularly adapted for use with printed circuit boards, it is more generally applicable to panels having detectable targets thereon.

Printed circuit boards are typically constructed as a laminate of layers of a conductive metal, such as copper, and insulating layers. The target may be formed of particular configurations resulting from the removal of selected portions of the copper layers. This invention is not, however, dependent upon any particular type or configuration of target on the printed circuit board.

With this invention, the targets are located with detection means rather than in a manual process. Although various detection means can be used, it is preferred to use a radioactive detection apparatus, such as an x-ray, beta ray or gamma ray detection apparatus. Of this group, an x-ray detection apparatus is preferred because the source is easily controlled, and they are readily available.

To enable the radioactive detection apparatus to locate the target, the printed circuit board or other panel and the radioactive detection apparatus are relatively moved along a search path. The search path is preferably programmed in a way to bring about rapid detection of the target. One preferred search path extends from a central location of a search area to the perimeter of the search area and then extends along the perimeter of the search area.

To hasten location of the target, the detection apparatus is first used to roughly locate the target. Thereafter, the resolution of the detection apparatus is increased to facilitate locating the target more accurately. In other words, the detection apparatus has a relatively large field of view for use in roughly locating the target and a narrower field of view for use in finely locating the target.

Although this invention is fully applicable to the location of one or more targets, it is common for printed circuit boards to have at least two targets. After both of these targets are located, this invention provides means for determining the distance between the centers of these two targets and comparing the measured distance to a predetermined desired spacing between the centers of the targets to thereby identify any spacing error that may exist as a result of placement of the targets on the board. To reduce this error, this invention provides first and second adjusted target locations which are displaced substantially equal distances from the first and second targets, respectively, and which are spaced apart by the desired spacing. Although the printed circuit board could be visibly marked with these adjusted target locations, this is not necessary. Nevertheless, the adjusted target locations are the locations which are used for performing subsequent operations on the board. For example, a work operation, such as the drilling of the registration holes, may be performed at a known location with respect to the adjusted target locations, and typically such drilling will be carried out at the adjusted target locations.

With the targets located, various other operations can be performed with respect to the board utilizing the locations of the targets. For example, the angular orientation of the printed circuit board can be determined using the location of two or more of the targets. The printed circuit board can then be pivoted to a desired angular orientation in preparation for a shearing operation so that the edges of the board will be sheared at the desired angle. Another operation that may be performed on the panel is rejecting the panel for any of a variety of reasons which make it unacceptable.

In a preferred and advantageous construction, a board is placed, either manually or automatically, on an X-Y table and releasably retained thereon during the target locating and board orientation and drilling steps. Thereafter, the board with the hole drilled therein is transferred to a rotatable table which pivots it to the desired angular orientation and then advances it to a set of shears for shearing the edges of the board. From this station, the board is transferred to one of two discharging locations provided for acceptable boards and rejected boards, respectively.

Although the panels can be manually placed on the X-Y table, it is preferred to automate this function utilizing a loading carrier that moves from a loading station to the work station at which the X-Y table is located. The carrier can releasably attach itself to, and pick up, an uppermost board from a stack. To assist in separating the uppermost board from the stack, a platform on which a stack of the boards is located, is lowered after the loading carrier becomes attached to the uppermost board.

The invention, together with additional features and advantages thereof, may best be understood by reference to the following description taken in connection with the accompanying illustrative drawings.

BRIEF DESCRIPTION OF THE DRAWINGS

FIG. 1 is a top plan view of one form of printed circuit board with which the present invention can be used.

FIG. 2 is an enlarged fragmentary sectional view taken generally along line 2—2 of FIG. 1.

FIG. 3 is an enlarged fragmentary plan view with portions broken away of the printed circuit board.

FIG. 4 is a plan view of another form of printed circuit board with which the present invention is usable.

FIG. 5 is a top plan view of one form of apparatus constructed in accordance with the teachings of this invention.

FIG. 6 is an elevational view taken generally along line 6—6 of FIG. 5 and illustrating a first work station.

DESCRIPTION OF THE PREFERRED EMBODIMENT

Figure 7:
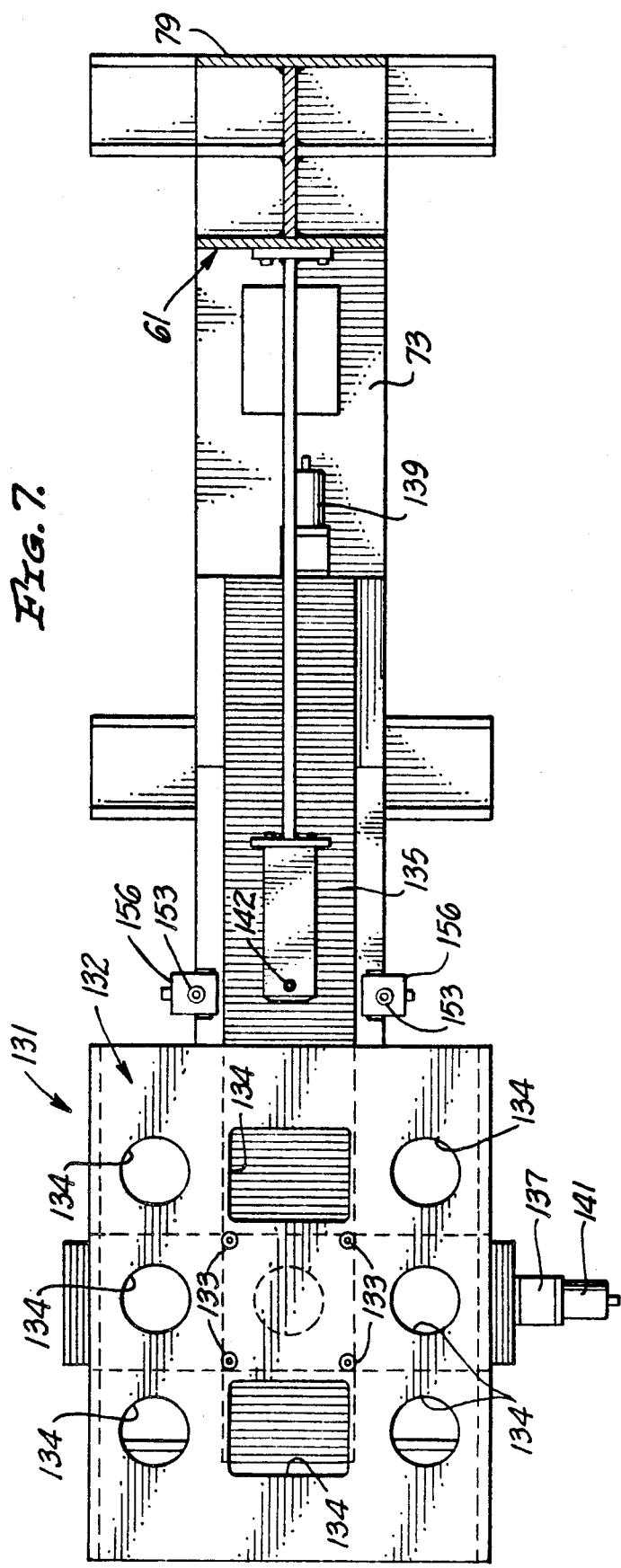
FIG. 7 is a view taken generally along line 7—7 of FIG. 6.

FIGS. 1-3 show by way of example one form of printed circuit board 11 to which the present invention is applicable. The printed circuit board 11 is conventional and per se forms no part of the present invention. The primary significance of the printed circuit board 11 to the present invention is that it includes targets 13, 15 and 17 which are detectable with the method and apparatus of this invention.

The printed circuit board 11 is generally rectangular and has generally parallel, opposed side edges 19 and generally parallel, opposed end edges 21. In this embodiment, the target 13 is closely adjacent one of the end edges 21, and the targets 15 and 17 are closely adjacent the other end edge 21.

As shown by way of example in FIG. 2, the printed circuit board 11 comprises face sheets 23 of copper or the like and intermediate layers of a dielectric 25 and copper 27. The targets 13, 15 and 17 can be provided, for example, by selectively removing regions of the copper layers 27 in a predetermined manner so as to form a pattern having a desired configuration. Although the targets can be of various different configurations, in this embodiment, they are formed by removing alternating annular regions of the copper layers 27 to form a target that comprises a series of rings as shown in FIG. 3, with each of the targets having a center 29 and an orientation dot 31 within the target where the copper has been removed. By removing regions of the copper layers 27 in this fashion, the target becomes differentially radiopaque across its area and can be detected with a radioactive detection apparatus, such as an x-ray detection apparatus. In the embodiment illustrated, each of the orientation dots 31, which is an optional feature of the target, is at a 9 o'clock position in the associated target, but this is merely illustrative.

To facilitate locating of the targets 13, 15 and 17, the printed circuit board 11 preferably has a bleed pattern or border 33 (FIG. 3) which also has known radiopaque characteristics that would be detectable by a radioactive detection apparatus. For example, the border 33 may comprise a series of dots 35 resulting from removal of all copper except circular regions of the copper layers 27. The board 11 also has openings 37 which are used in the manufacture of the board 11.

FIG. 4 shows another form of printed circuit board 11a to which the present invention is also applicable. The printed circuit board 11a is identical to the printed circuit board 11, except for those characteristics shown or described herein as being different. Portions of the printed circuit board 11a corresponding to portions of the circuit board 11 are designated by corresponding reference numerals followed by the letter "a."

The primary difference between the circuit boards 11 and 11a is that the latter includes two separate board sections 45 and 47 adapted to be eventually separated along a line 49 into two separate circuit boards. Of course, the printed circuit board 11a may comprise any desired number of the board sections.

FIGS. 5-9 show an apparatus 51 for locating the targets 13, 15 and 17 and performing one or more operations with respect to the location of one or more of the targets. Generally, the apparatus 51 has a loading station 53 (FIG. 5), a locating and drilling station 55, a shearing station 57 and an unloading station 59. The apparatus 51 comprises a suitable supporting structure 61 (FIGS. 5, 6 and 9), an elongated rail 63 (FIGS. 5, 6 and 9) mounted for movement on the supporting structure 61, and loading, intermediate and unloading carriers 65, 67 and 69 for transferring the printed circuit board 11 from the loading station 53, the locating and drilling station 55 and the shearing station 57, respectively.

The supporting structure 61 can, of course, be of any suitable construction to support the applicable components of the apparatus 51, and the construction shown is purely illustrative. Thus, the supporting structure 61 may include a generally U-shaped frame 71 (FIG. 6) at the locating and drilling station 55, with the frame having a lower table-like leg 73 securely fixed to the floor 75 or other supporting surface, an upper horizontal leg 77 and a vertical web 79 interconnecting the two legs.

At the shearing station 57 (FIG. 9), the supporting structure 61 comprises a frame 81, including a lower leg 83, with a table-like section securely affixed to the floor 75, two horizontal upper legs 85 and a vertical web 87 interconnecting the legs 83 and 85. The frames 71 and 81 may be suitably interconnected, if desired, and the supporting structure may include additional elements as needed for appropriate support of the other components of the apparatus 51.

The rail 63 is mounted for reciprocating movement along its length in any suitable manner on the leg 77 (FIG. 6) and on downward extensions 89 (FIG. 9) of the legs 85 such as by a tubular beam 88. The carriers 65, 67 and 69 are mounted on the rail 63 for reciprocating movement therewith. The rail 63 can be reciprocated between an initial position shown in FIG. 5 and an advanced position in which each of the carriers 65, 67 and 69 are advanced one station to the left as viewed in FIG. 5. This reciprocating motion of the rail 63 can be provided in any suitable manner, such as by a conventional pneumatic actuator 90 (FIG. 5) and an associated conventional cable drive.

Each of the carriers 65, 67 and 69 may be identical, and corresponding portions are designated by corresponding reference numerals. Any carrier which can accurately pick up and deposit the board 11 can be used, and the carriers 65, 67 and 69 are merely illustrative.

As shown in FIG. 6, the intermediate carrier 67 includes a support plate 91 having releasable retaining means in the form of resilient suction-cup vacuum holders 93 extending downwardly from the support plate. The holders 93 are movable vertically relative to the support plate 91 and are biased downwardly by springs 94 (FIG. 9) which act against the support plate 91 so that the holders can move vertically relative to each other to accommodate height variations in the board being picked up. The support plate 91, with the vacuum holders 93 attached thereto, is mounted for vertical reciprocating movement by guide rods (not shown) which can be reciprocated in a bearing block 97 suitably affixed to the rail 63. An air cylinder 98 has a reciprocable actuator rod 99 coupled to the support plate 91. The air cylinder 98 can be actuated to reciprocate the rod 99 and hence the support plate 91 and holders 93 relative to the bearing block 97 in a vertical direction. The holders 93 can be attached to the circuit board 11 near the lower end of its stroke by a vacuum applied through conduits 100 and accurately releasably retain the circuit board so gripped in the same orientation as when the board was picked up. The vacuum pressure resulting from attachment of the holders 93 to the board 11 can be used as a signal to raise the carrier 67 with the air cylinder 98. The holders 93 can be caused to release the circuit board 11 by placing the board on a surface, applying a vacuum to the surface on which the board is placed and then releasing the vacuum.

Figure 8:
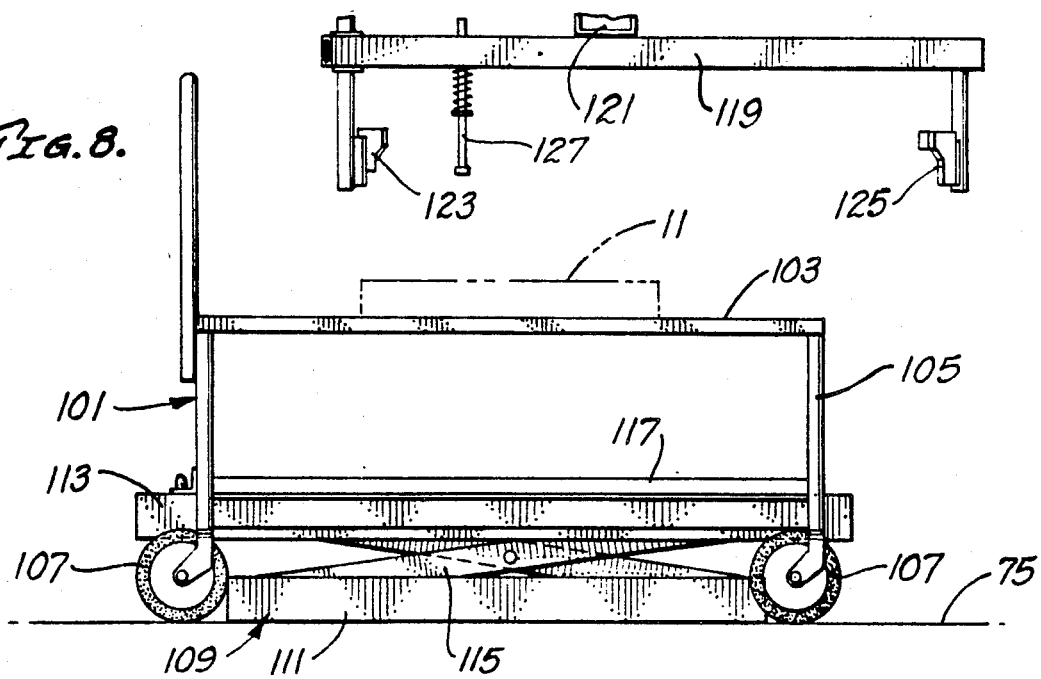
FIG. 8 is a side elevational view of a loading station with the carrier removed taken generally along line 8—8 of FIG. 5.

Although the printed circuit board 11 can be manually placed on the locating and drilling station 55, it is preferred to automate this function, and this can be accomplished, for example, as shown at the loading station 53 in FIGS. 5 and 8.

A stack of the printed circuit boards 11 is supported on a cart 101 which includes a broad support member 103 having the stack of printed circuit boards 11 resting thereon, a suitable frame 105 for supporting the support member 103 horizontally above the floor 75 and wheels 107 coupled to the frame to enable the cart with a stack of the printed circuit boards thereon to be pushed to the loading station 53. The cart 101 is positioned above a conventional commercially available scissors lift or elevator 109 which may include a base 111 affixed to the floor 75, an elevator table 113 and a scissors linkage 115 coupled in a conventional fashion to the base 111 and the table 113. The elevator table 113 can be raised and lowered in a known manner by one or more hydraulic actuators (not shown), with the opposite ends of the scissors linkage 115 sliding in grooves (not shown) in the base 111 and the table 113. The frame 105 of the cart 101 has frame members 117 (only one being shown in FIG. 8) which rest on the table 113 to permit the elevator 109 to raise and lower the entire cart 101.

There are several advantages to being able to raise and lower the cart 101. First with the cart elevated to lift the wheels 107 off of the floor 75, it occupies a fixed position during pickup of each of the boards 11 from the stack. Secondly, by being able to slightly lower the cart 101 upon attachment of the loading carrier 65 to the uppermost of the boards 11 of the stack, separation of the uppermost board from the rest of the stack is facilitated. The vacuum pressure resulting from attachment of the holders 93 to the board 11 can be used as a signal to lower the elevator 109 and the cart 101. Thus, the cart 101 can be raised and lowered by the elevator 109 in accordance with any suitable program to achieve these desirable results.

A frame 119 (FIGS. 5 and 8) is suitably mounted on a portion 121 of the supporting structure 61 and carries a photocell 123, a sensor 125 aligned with the photocell and a spring-biased plunger 127. The photocell 123 and the sensor 125 detect when the height of the stack of boards 11 drops below a predetermined level and provides a signal for further elevating the scissors lift 109 or sounds an alarm indicating additional boards 11 should be placed on the support member 103. The spring-biased plunger 127 is arranged to engage a peripheral region of the board 11 being lifted by the loading carrier 65 and to deflect such peripheral region so as to reduce the likelihood that the next lower board will stick to the board being picked up by the loading carrier.

The printed circuit board 11 from the loading station 53 is transferred by the carrier 65 to an X-Y table 131 which constitutes a support for the board at the locating and drilling station 55 (FIGS. 5–7) The X-Y table 131 has a support plate 132 (FIG. 7) with vacuum openings 133 (FIG. 7) through which vacuum pressure can be applied for releasably retaining a printed circuit board 11 on the X-Y table and drilling openings 134. The X-Y table 131 is mounted for movement in the "X" direction by a suitable track 135 fixedlY mounted on the leg 73 of the frame supporting structure 61 (FIG. 6) and in the "Y" direction by a track 137 (FIGS. 6 and 7) carried by the track 135. The X-Y table 131 is movable along the tracks 135 and 137 in any suitable manner, such as by motors 139 and 141, respectively. Except for the support plate 132, the X-Y table 131 may be conventional.

The apparatus 51 also includes a conventional, commercially available x-ray detection apparatus 143. The detection apparatus 143 includes an x-ray source 142 fixedly mounted on the web 79 of the supporting structure 61 and an x-ray receiver 144 (FIG. 6). The receiver 144 includes an x-ray detector 145 aligned with the x-ray source 142, a photo-multiplier 146 and a T.V. camera 147. The receiver 144 is mounted on the upper leg 77 of the supporting structure 61 for vertical reciprocating movement in any suitable manner between two known positions. With this construction, the receiver 144 can be moved vertically between an upper or high-resolution position providing a relatively small field of view and a lower or low-resolution position providing a larger field of view as shown in FIG. 6. Although the receiver 144 can be mounted for such vertical reciprocating movement in various ways, in this embodiment, the mounting means includes a mounting plate 148, couplings 149 for mounting the receiver 144 on the mounting plate 148, a pair of guide rods 150 (only one being shown in FIG. 6) fixedly mounted on the leg 77, bearings 152 for mounting the mounting plate 148 for vertical reciprocating movement on the guide rods 150, and an air cylinder 154 coupled to the legs 77 and shown schematically in FIG. 6. The air cylinder can be operated to move the mounting plate, and hence the receiver 144, vertically between the upper and lower positions described above. The mounting means for the receiver 144 preferably includes hard stops (not shown) for positively defining the upper and lower positions.

Figure 10:
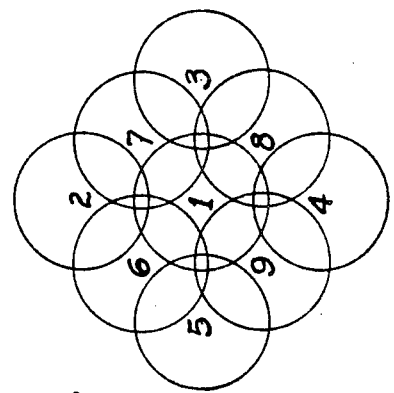
FIG. 10 is a view illustrating a preferred search pattern.

The X-Y table 131 can be moved by the motors 139 and 141 relative to the x-ray detection apparatus 143 in any desired search pattern so that the detection apparatus can locate the targets 13, 15 and 17 in any desired sequence. Although the search path could be random, it is preferably a programmed path reasonably calculated to minimize the searching time in finding the targets. Although various different search paths can be used, and any of the targets may be searched for first, preferably, the X-Y table 131 first moves the printed circuit board 11 carried thereon to a position reasonably calculated to be in the approximate vicinity of the target 15. With the x-ray detection apparatus 143 in its low-resolution position, the X-Y table and the circuit board thereon are moved through an appropriate search pattern, such as the one shown in FIG. 10. Each of the circles shown in FIG. 10 comprises a field of view of the receiver 144 of the detection apparatus 143, and the number of the circles shows the relative positions of the detection apparatus 143 and the X-Y table 131. Thus, the search path extends from a central location of a search area designated by the circle 1 to the perimeter of the search area at the circle 2 and then extends progressively along the perimeter to search areas 3, 4, 5 and 6 in that order. The search path then extends across the search area several times from the circles 6 to 7, 7 to 8 and 8 to 9 in that order. Although the scan of the detection apparatus 143 could be continuous, in this embodiment, the X-Y table 131 stops at each of the positions represented by the circles 1–9 so that the detection apparatus can "look for" the target.

Because the boards 11 can be placed onto the X-Y table 131 in any of four different orientations, i.e., with the target 15 to the left or right as viewed in FIG. 7 and with the board being either face up or face down, no target may be present at the first area searched. Accordingly, if no target is located during the search described with reference to FIG. 10, the X-Y table 131 is positioned to a second area directly across the board from the first area searched, and the search pattern described above with reference to FIG. 10 is repeated. If no target is located after searching the second area, the only operation thereafter performed on it is to reject it as described more fully hereinbelow.

If a target is located at low resolution, the electronics or software described below estimates the distance from the center of the field of view to the centroid of the target and sends a command to the X-Y table 131 to center the target within the field of view. Because of distortions introduced by the x-ray detection apparatus 143, generally the target will be moved closer to the center of the field of view but not within the tolerances desired. Accordingly, the receiver 144 is raised to the upper or high-resolution position to provide a narrower field of view with better resolution. If at improved resolution, the target believed to have been located at low resolution is not in fact present, the search is continued or the board is rejected as described below. However, if a target is located at high resolution, the software or electronics described below estimates the distance between the center of the field of view and the centroid of the target and commands the X-Y table 131 to move the centroid of the target to the center of the field of view. This centering technique can be repeated until the centroid of the target is adequately centered in the field of view. These steps and the calculation of the X-Y coordinates of the target can be carried out very rapidly.

Distortions are inherently present in a system of this type, and such distortions exist primarily in the x-ray detection apparatus 143. By moving all of the targets 13, 15 and 17 to the same position in the field of view, these distortions affect all images to the same degree. Consequently, the accuracy of the system when used in this fashion depends upon the repeatability of the relevant components of the apparatus rather than their absolute accuracy.

After the first target has been located on high resolution, the X-Y table 131 moves in the appropriate direction a distance reasonably calculated to bring the target 13 into the field of view of the receiver 144, and target searching is repeated as described above. If no target is found, the X-Y table 131 is moved in the "Y" direction a distance corresponding to the desired distance between the targets 15 and 17, and the target search process is again repeated. If the target still is not located, the table is moved in the opposite "Y" direction twice the amount it was originally moved in the "Y" direction, and the search process is again repeated. If the second target is not located during this latter search, the board is rejected. If the second target is located, it is assumed to be the target 13, and its X-Y coordinates are determined. There are then two possible locations for the target 17, i.e., either to the left or right of the target 15. With the detection apparatus 143 in the high-resolution position, the X-Y table 131 moves the board 11 to the closer of the two positions, and the target-recognition process described above is repeated. If the third target is not found, the X-Y table 131 is moved to the second of these positions, and the target-recognition process is repeated again.

If the third target is not located after searching both of these locations, the board is rejected as described below. If the third target is found, its X-Y coordinates are established, and the distance between the centers of the targets 13 and 15 is determined and compared with the predetermined desired spacing between the centers of these targets to provide a spacing error calculation. If the spacing error is more than a predetermined amount, such as 0.02 inch, the board is rejected. If the spacing error is less than the predetermined amount, adjusted target locations are determined for the board, with such first and second adjusted target locations being substantially equal distances from the targets 13 and 15, respectively, and with the adjusted target locations having the predetermined spacing between the centers thereof, i.e., having no spacing error. An adjusted target location may similarly be determined for the target 17, if desired.

This technique provides the desired spacing between the adjusted target locations and reduces by one half any error in the distance between the adjusted target locations and the edges of the board. In this regard, one reason for a variation in spacing between the targets 13 and 15 is that the boards 11 tend to shrink during their manufacture, and the use of the projected target locations in lieu of the actual target locations reduces this error by one half and provides accurately controlled spacing between the adjusted target locations.

Next, the X-Y table 131 is positioned with respect to one or more of the adjusted target locations so that a work operation can be performed on the board. The openings 134 are large enough and located with respect to normal board placement on the support plate 132 so that each target to be drilled is in registry with an opening 134. In this embodiment, the X-Y table 131 is first moved to position the adjusted target location for the target 13 immediately beneath one of a pair of conventional drill heads 151 (FIG. 5). A conventional drill support 153 (FIG. 6) is then raised by an air actuator 156 to support the board 11 within the opening 134 immediately below the drill head 151. With the components in this position, the drill head 151 drills a hole through the adjusted target location for the target 13. This sequence is repeated two more times to drill holes in the adjusted target locations for the targets 15 and 17.

Based upon the adjusted target locations, which coincide, respectively, with the drilled hole locations, the location of the center of the board 11 is identified, and the angular orientation of the board is determined. With the angular orientation of the board 11 known, the rotation necessary to make board "square" for the next work operation can also be determined based upon the tooling hole location.

The X-Y table 131 is then returned to a known position with respect to the intermediate carrier 67, and the carrier 67 picks up the drilled board and transfers it to a rotatable table 155 (FIGS. 5 and 9) at the shearing station 57. The board 11 may be releasably retained on the rotatable table 155 in any suitable manner, such as by a vacuum.

Simultaneously, the loading carrier 65 transfers a new board 11 to the X-Y table 131, whereupon the target location and drilling functions discussed above are repeated for the new board.

Because the carrier 67 accurately transfers the board 11 to the rotatable table 155, the orientation, including the angular orientation of the board 11 on the table 155 is known. Accordingly, the rotatable table 155 is rotated by a suitable stepping motor 158 (not shown) to provide the circuit board 11 with the desired angular orientation which, in this embodiment, is to make it "square" with respect to a shearing device 157 which shears all four edges of the board 11 a desired amount. If the board 11 on the rotatable table 155 was rejected for any of the reasons described hereinabove, no shearing of that board takes place.

Figure 9:
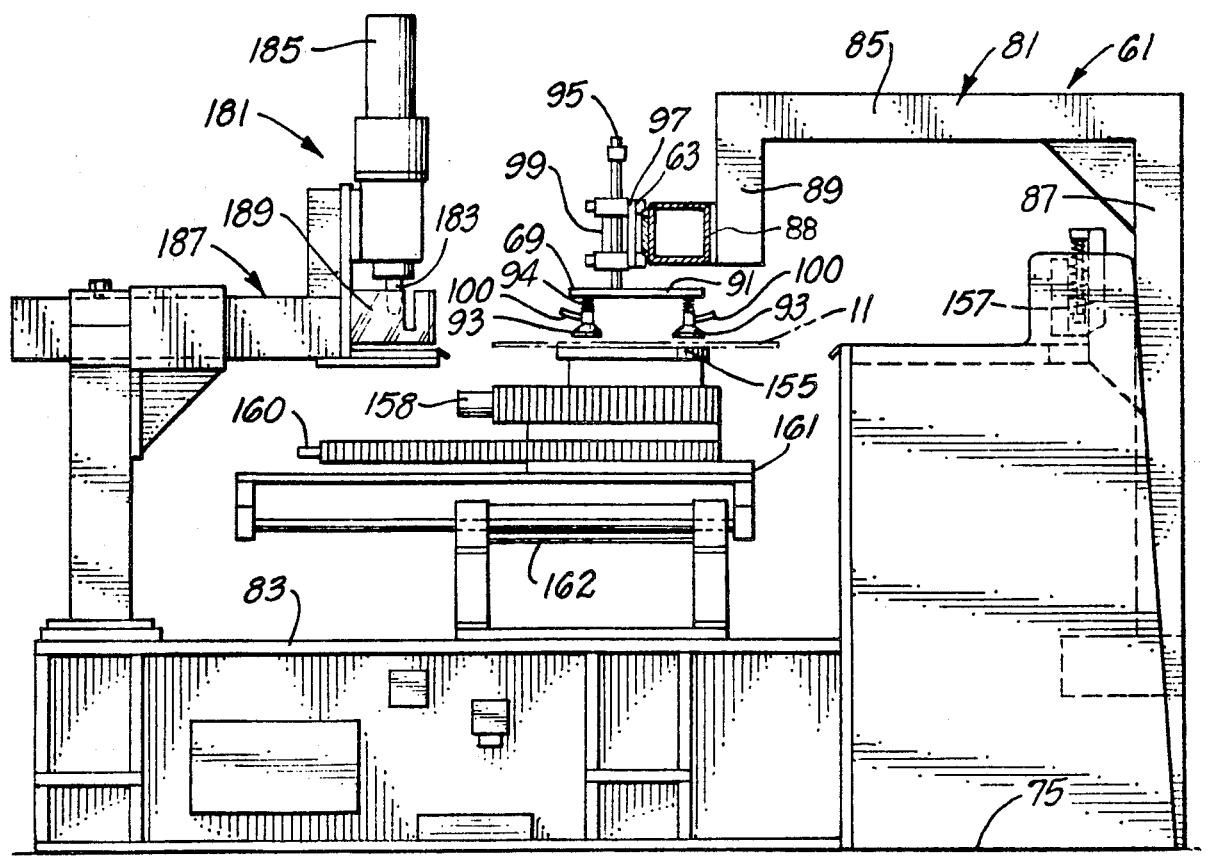
FIG. 9 is an elevational view of a second work station taken generally along line 9—9 of FIG. 5.

The rotatable table 155 is mounted on a fine positioning "X" table 159 (FIG. 9). The table 159 is in turn mounted on a larger "X" table 161 movable by an air cylinder 162. The "X" table 161 is in turn supported on the lower leg 83 of the frame 81.

With the board 11 in position on the rotatable table 155, the "X" table 161 is advanced toward the shearing device 157, and the "X" table 159 is advanced toward the shearing device 157 to finely position one edge of the board 11 the correct distance into the shearing device 157. On completion of this first shearing operation, the rotatable table 155 is rotated 180 degrees to shear the second edge of the board 11. Upon completion of this second shearing operation, the rotatable table 155 is rotated 90 degrees counterclockwise for the shearing of the third edge and then 180 degrees counterclockwise for the shearing of the fourth edge. Finally, both of the "X" tables 159 and 161 are retracted from the shearing device 157 back to the position shown in FIG. 9.

Next, the X-table 161 moves the rotatable table 155 to the left as viewed in FIG. 9 to place the left edge of the board 11 into a stamp 181 which applies appropriate markings to the board. Marking of the board 11 with the stamp 181 is one additional example of a work operation that can be performed on the board. Although the stamp 181 can be of various different constructions, in this embodiment, it includes a ram 183 which is vertically reciprocated by an air cylinder 185 to stamp or apply markings to the board 11. The stamp 181 is mounted on an adjustable frame 187 which forms a portion of the supporting structure 61. The stamp 181, which may be conventional, preferably includes a protective cover 189 around the stamping area. Upon the next indexing movement of the rail 63, the unloading carrier 69 picks up the drilled and sheared board 11 and moves it to the unloading station 59. The unloading station 59 includes a reject table 171 (FIG. 5) and a product table 173. The unloading carrier 69 releases its vacuum to deposit the board 11 on the reject table 171 if it has been rejected at the locating and drilling station 55 or on the product table 173 if the board has been properly drilled and sheared.

The various motors and actuators and the sequence of operations and movements described above can be accomplished in a conventional manner with suitable electric or electronic controls or with an appropriately programmed microprocessor. Similarly, the mathematical determinations, computations, and comparisons described above, such as those mathematical steps involved in target location, are preferably carried out with an appropriately programmed microprocessor.

It will be apparent to those skilled in the art that many variations can be made to the specific embodiment illustrated without departing from the spirit and scope of the invention. For example, no work operation needs to be performed at the locating and drilling station 55. Similarly, various work operations in addition to, or in lieu of, drilling and shearing may be performed on the board at the same or different work stations.

Although an exemplary embodiment of the invention has been shown and described, many changes, modifications and substitutions may be made by one having ordinary skill in the art without necessarily departing from the spirit and scope of this invention.

We claim:

1. A method for use with a panel having sheet material on opposite faces of the panel and at least a first target between the sheet material which is detectable with radioactive rays, said method comprising:
   relatively moving the panel and a radioactive detection apparatus along a search path;
   directing radioactive rays from the detection apparatus toward the panel to accurately locate the first target without removing any of the sheet material; and
   performing a work operation on said panel utilizing the location of the first target, said work operation being carried out at a known location on said panel with respect to the first target.

2. A method as defined in claim 1 wherein said step of relatively moving includes relatively moving the panel and the detection apparatus along a programmed search path.

3. A method as defined in claim 1 wherein said step of relatively moving includes relatively moving the panel and the detection apparatus along a search path which extends from a central location of a search area to the perimeter of the search area and then extends along the perimeter of the search area.

4. A method as defined in claim 1 wherein said step of relatively moving includes relatively moving the panel and the detection apparatus to roughly locate the first target and thereafter increasing the resolution of the detection apparatus to more accurately locate the first target.

5. A method as defined in claim 1 wherein the panel has a second target and said method includes carrying out said steps of relatively moving and directing to locate said second target and said step of performing includes determining the distance between the centers of the first and second targets.

6. A method as defined in claim 5 wherein said step of performing includes comparing said distance to a predetermined desired spacing between the centers of the first and second targets to provide spacing error and providing first and second adjusted target locations which are displaced substantially equal distances from the first and second targets, respectively, to reduce the spacing error.

7. A method as defined in claim 6 wherein said step of performing includes performing a work operation on said panel at a known location with respect to said first adjusted target location.

8. A method as defined in claim 6 wherein said panel is a printed circuit board and said work operation includes drilling first and second holes at said adjusted first and second target locations, respectively.

9. A method for performing work operations on a printed circuit board having at least first and second targets, said method comprising:
 moving the printed circuit board in an X-Y plane relative to a detection apparatus to locate the first target;
 drilling a hole in the printed circuit board substantially at the first target;
 locating the second target;
 determining the angular orientation of the printed circuit board using the location of the first and second targets;
 pivoting the printed circuit board from the angular orientation determined to a desired angular orientation; and
 shearing at least two of the edges of the printed circuit board following said step of pivoting.

10. A method as defined in claim 9 wherein said step of drilling is carried out at a first work station and including transferring the printed circuit board with the hole drilled therein to a second work station and carrying out said step of pivoting at said second work station.

11. A method for use with a panel having at least a first target thereon detectable with radioactive rays, said method comprising:
 relatively moving the panel and a radioactive detection apparatus along a search path;
 directing radioactive rays from the detection apparatus toward the panel to locate the first target;
 performing an operation with respect to the first panel utilizing the location of the first target, said step of performing including drilling a hole in said panel at a known location with respect to said first target; and
 transferring the panel with the drilled hole therein to another work station and shearing a plurality of the edges of the panel at said another work station.

12. A method for use with a panel having at least a first target thereon detectable with radioactive rays, said method comprising:
 relatively moving the panel and a radioactive detection apparatus along a search path, said step of relatively moving including relatively moving the panel and the detection apparatus along a search path which extends from a central location of a search area to the perimeter of the search area and then extends along the perimeter of the search area;
 directing radioactive rays from the detection apparatus toward the panel to locate the first target; and
 performing an operation with respect to the panel utilizing the location of the first target.

13. An apparatus for use with a panel having face sheets and at least a first target between the face sheets which is detectable with radioactive rays, said apparatus comprising:
 a support adapted to receive the panel, said support including means for releasably retaining the panel thereon;
 a radioactive detection apparatus for directing rays toward the support;
 means for relatively moving the support and the detection apparatus along a search path whereby the detection apparatus can locate the first target through at least one of the face sheets; and
 means for performing a work operation on the panel using the location of the first target, said work operation being carried out at a known location on said panel with respect to the first target.

14. An apparatus as defined in claim 13 wherein said moving means relatively moves the support and the detection apparatus along a programmed search path.

15. An apparatus as defined in claim 13 wherein said moving means relatively moves the support and the detection apparatus along a search path which extends from a central location of a search area to the perimeter of the search area and then along the perimeter of the search area.

16. An apparatus as defined in claim 13 wherein said detection apparatus includes means for varying the field of view of the detection apparatus to thereby facilitate locating of the first target.

17. An apparatus as defined in claim 13 wherein the panel has a second target and said performing means includes means for determining the distance between the centers of the first and second targets.

18. An apparatus as defined in claim 17 wherein said performing means includes means for comparing said distance to a predetermined desired spacing between the centers of the first and second targets to provide spacing error and means for providing first and second adjusted target locations which are displaced from the first and second targets, respectively, to reduce the spacing error.

19. An apparatus as defined in claim 16 wherein said performing means includes means for performing a work operation on said panel at a known location with respect to said first adjusted target location.

20. An apparatus as defined in claim 16 wherein said panel is a circuit board and said performing means includes means for drilling first and second holes at said first and second adjusted target locations, respectively.

21. An apparatus as defined in claim 13 wherein said detection apparatus includes an x-ray detection apparatus.

22. An apparatus as defined in claim 13 wherein said support has a drilling opening therein and said performing means includes means for drilling a hole in the panel at said drilling opening and means for supporting the panel at said drilling opening.

23. An apparatus for performing work operations on a printed circuit board having at least one target thereon, said apparatus comprising:
 an X-Y table for receiving the printed circuit board and having means for retaining the printed circuit board thereon;
 detection means for locating the first target;

means for moving the X-Y table relative to the detection means to locate the first target;

means for drilling a hole in the printed circuit board substantially at the first target;

a rotatable table;

means for transferring the printed circuit board with the hole drilled therein to the rotatable table;

means for retaining the printed circuit board on the rotatable table;

means for pivoting the rotatable table; and means for shearing at least one of the edges of the printed circuit board with the printed circuit board retained on the rotatable table.

24. An apparatus as defined in claim 23 including means responsive to the location of at least the first target for ascertaining the angular orientation of the printed circuit board and said transferring means transfers the printed circuit board to the rotatable table in substantially said angular orientation.

25. An apparatus as defined in claim 24 including means responsive to said angular orientation for pivoting the rotatable table to place the printed circuit board in a desired angular orientation.

26. An apparatus as defined in claim 23 wherein said drilling means is positioned and operative to drill the hole in the printed circuit board when the printed circuit board is retained on the X-Y table.

27. An apparatus as defined in claim 23 wherein said X-Y table and said rotatable table are at first and second work stations, respectively, said transferring means includes a rail extending between the first and second work stations, a carrier on the rail and means for moving the carrier and the rail for movement of said carrier between the first and second work stations, and said carrier includes means for releasably retaining the printed circuit board.

28. An apparatus as defined in claim 27 wherein said rail extends proximally beyond the first work station to a loading station and distally beyond the second work station to a discharge station and said apparatus includes a loading carrier movable with the rail from the loading station to the first work station and an unloading carrier movable with the rail from the second work station to the discharge station, and each of said loading and unloading carriers include means for releasably retaining the printed circuit board.

29. An apparatus as defined in claim 28 wherein said apparatus includes a loading platform at the loading station adapted to have a stack of the panels thereon, means for raising and lowering the platform, said loading carrier includes means for moving the releasable retaining means of the loading carrier toward and away from the stack of panels on the platform when the loading carrier is at the loading station whereby the loading carrier can be attached to and pick up the uppermost panel from the stack.

30. An apparatus as defined in claim 23 including means for moving the rotatable table toward and away from the shearing means.

31. An apparatus as defined, in claim 25 wherein said X-Y table and said rotatable table are at first and second work stations, respectively, said transferring means includes a rail extending between the first and second work stations, a carrier on the rail and means for moving the carrier and the rail for movement of said carrier between the first and second work stations, said carrier including means for releasably retaining the printed circuit board, and said apparatus includes means for moving the rotatable table toward and away from the shearing means.

32. An apparatus for use with a panel having at least first and second targets, said apparatus comprising:

a support adapted to receive the panel, said support including means for releasably retaining the panel thereon;

means for detecting the locations of the first and second targets on the panel;

means for determining the distance between the centers of the first and second targets;

means for comparing said distance to a predetermined spacing between the centers of the first and second targets; and means for projecting first and second adjusted target locations on said printed circuit board, with the first and second adjusted target locations being substantially equal distances from the first and second targets, respectively, and with the first and second target locations having said predetermined spacing between the centers thereof.

33. An apparatus as defined in claim 32 including means for performing a work operation on said panel at a known location with respect to said first adjusted target location.

34. An apparatus as defined in claim 32 including means for drilling first and second holes in said panel at said first and second adjusted target locations, respectively.

35. An apparatus for performing a work operation on a panel comprising:

a loading platform at a loading station adapted to have a stack of the panels thereon;

means for raising and lowering the platform;

means at a first work station for performing an operation with respect to one of the panels;

a carrier;

means for mounting the carrier for movement from the loading station to the first work station;

said carrier including means for releasably retaining a panel and means for moving the releasable retaining means toward and away from the stack of panels on the platform when the carrier is at the loading station whereby the carrier can be attached to and pick up the uppermost panel from the stack; and means for lowering the platform to assist in separating the uppermost panel from the stack.

36. An apparatus as defined in claim 35 wherein said lowering means is responsive to the loading carrier becoming attached to the uppermost panel for lowering the platform.

37. An apparatus for use with a panel having at least a first target thereon detectable with radioactive rays, said apparatus comprising:

a support adapted to receive the panel, said support including means for releasably retaining the panel thereon;

a radioactive detection apparatus for directing rays toward the support;

means for relatively moving the support and the detection apparatus along a search path whereby the detection apparatus can locate the first target;

means for performing an operation with respect to the first panel which uses the location of the first target;

said performing means including a drill for drilling a hole in said panel;

means for transferring the panel with the hole drilled therein to another work staiton; and means for shearing at least one edge of the panel at said another work station.

38. An apparatus for use with a panel having at least a first target thereon detectable with radioactive rays, said apparatus comprising:

a support adapted to receive the panel, said support including means for releasably retaining the panel thereon;

a radioactive detection apparatus for directing rays toward the support;

means for relatively moving the support and the detection apparatus along a search path whereby the detection apparatus can locate the first target;

means for performing an operation with respect to the first panel which uses the location of the first target;

said performing means including means for determining the angular orientation of the panel;

means for pivoting the panel to the desired orientation; and means for shearing at least one edge of the panel.

39. An apparatus for use with a panel having at least a first target thereon detectable with radioactive rays, said apparatus comprising:

a support adapted to receive the panel, said support including means for releasably retaining the panel thereon;

a radioactive detection apparatus for directing rays toward the support;

means for relatively moving the support and the deteciton apparatus along a search path whereby the detection apparatus can locate the first target, said moving means relatively moving the support and the detection apparatus along a search path which extends from a central location of a search area to the perimeter of the search area and then along the perimeter of the search area; and means for performing an operation with respect to the first panel which uses the location of the first target.

* * * * *